United States Patent
Kan et al.

(10) Patent No.: US 11,758,642 B2
(45) Date of Patent: Sep. 12, 2023

(54) GROUNDING STRUCTURE FOR A PRINTED CIRCUIT BOARD OF AN INFORMATION HANDLING SYSTEM

(71) Applicant: Dell Products L.P., Round Rock, TX (US)

(72) Inventors: Fong-An Kan, New Taipei (TW); Chian-Ting Chen, New Taipei (TW); Po Hsiang Chuang, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 52 days.

(21) Appl. No.: 17/645,192

(22) Filed: Dec. 20, 2021

(65) Prior Publication Data

US 2023/0199938 A1    Jun. 22, 2023

(51) Int. Cl.
*H05K 1/02* (2006.01)

(52) U.S. Cl.
CPC ......... *H05K 1/0213* (2013.01); *H05K 1/0251* (2013.01)

(58) Field of Classification Search
CPC .... H05K 1/0251; H05K 1/0298; H05K 1/115; H05K 1/116; H05K 1/0213
See application file for complete search history.

(56) References Cited

U.S. PATENT DOCUMENTS

2006/0288574 A1* 12/2006 Oggioni .................. H01L 23/66
174/262

* cited by examiner

*Primary Examiner* — Jeremy C Norris
(74) *Attorney, Agent, or Firm* — McDermott Will & Emery LLP

(57) ABSTRACT

In one embodiment, a grounding structure for a printed circuit board (PCB) of an information handling system includes: a first ground via electrically coupled to a ground layer of the PCB; a second ground via electrically coupled to the ground layer of the PCB; and a conductive strip electrically coupling the first ground via to the second ground via, the conductive strip providing a vertical ground reference for a signal transferred from a first surface of the PCB to a second surface of the PCB through a signal via disposed on the PCB.

18 Claims, 4 Drawing Sheets

400

TRANSFER, BY A SIGNAL VIA DISPOSED ON A PRINTED CIRCUIT BOARD (PCB), A SIGNAL FROM A FIRST SURFACE OF THE PCB TO A SECOND SURFACE OF THE PCB.
410

PROVIDE, BY A CONDUCTIVE STRIP OF A GROUNDING STRUCTURE DISPOSED ON THE PCB, A VERTICAL GROUND REFERENCE FOR THE SIGNAL.
420

FIG. 4

GROUNDING STRUCTURE FOR A PRINTED CIRCUIT BOARD OF AN INFORMATION HANDLING SYSTEM

BACKGROUND

Field of the Disclosure

The disclosure relates generally to information handling systems, and in particular to a grounding structure for a printed circuit board of an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one embodiment, a disclosed grounding structure for a printed circuit board (PCB) of an information handling system includes: a first ground via electrically coupled to a ground layer of the PCB; a second ground via electrically coupled to the ground layer of the PCB; and a conductive strip electrically coupling the first ground via to the second ground via, the conductive strip providing a vertical ground reference for a signal transferred from a first surface of the PCB to a second surface of the PCB through a signal via disposed on the PCB.

In one or more of the disclosed embodiments, the first ground via and the second ground via include: a first conductive pad disposed on the first surface; a second conductive pad disposed on the second surface; and a conductive tube coupling the first conductive pad to the second conductive pad, the conductive tube electrically coupled to conductive strip and the ground layer of the PCB.

In one or more of the disclosed embodiments, the grounding structure is disposed on the PCB proximate to the signal via.

In one or more of the disclosed embodiments, the conductive strip is disposed within one or more inner layers of the PCB, the conductive strip oriented orthogonally in relation to the one or more inner layers.

In one or more of the disclosed embodiments, the information handling system further includes: an additional grounding structure disposed on the PCB, the additional grounding structure including: a third ground via electrically coupled to the ground layer of the PCB; and an additional conductive strip electrically coupling the third ground via to the second ground via, the additional conductive strip providing the vertical ground reference for the signal transferred from the first surface to the second surface through the signal via.

In one or more of the disclosed embodiments, the third ground via includes: a first conductive pad disposed on the first surface; a second conductive pad disposed on the second surface; and a conductive tube coupling the first conductive pad to the second conductive pad, the conductive tube electrically coupled to the additional conductive strip and the ground layer of the PCB.

In one or more of the disclosed embodiments, the additional grounding structure is disposed on the PCB proximate to the signal via and the grounding structure.

In one or more of the disclosed embodiments, the additional conductive strip is disposed within one or more inner layers of the PCB, the additional conductive strip oriented orthogonally in relation to the one or more inner layers.

In one or more of the disclosed embodiments, providing the vertical ground reference for the signal causes an insertion loss associated with the signal to be decreased.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

FIG. 4 is a flowchart depicting selected elements of an embodiment of a method for increasing a signal quality in an information handling system.

DESCRIPTION OF PARTICULAR EMBODIMENT(S)

This document describes a grounding structure for a printed circuit board (PCB) of an information handling system that includes: a first ground via electrically coupled to a ground layer of the PCB; a second ground via electrically coupled to the ground layer of the PCB; and a conductive strip electrically coupling the first ground via to the second ground via, the conductive strip providing a vertical ground reference for a signal transferred from a first surface of the PCB to a second surface of the PCB through a signal via disposed on the PCB.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-4 wherein like numbers are used to indicate like and corresponding parts.

Figure 1:
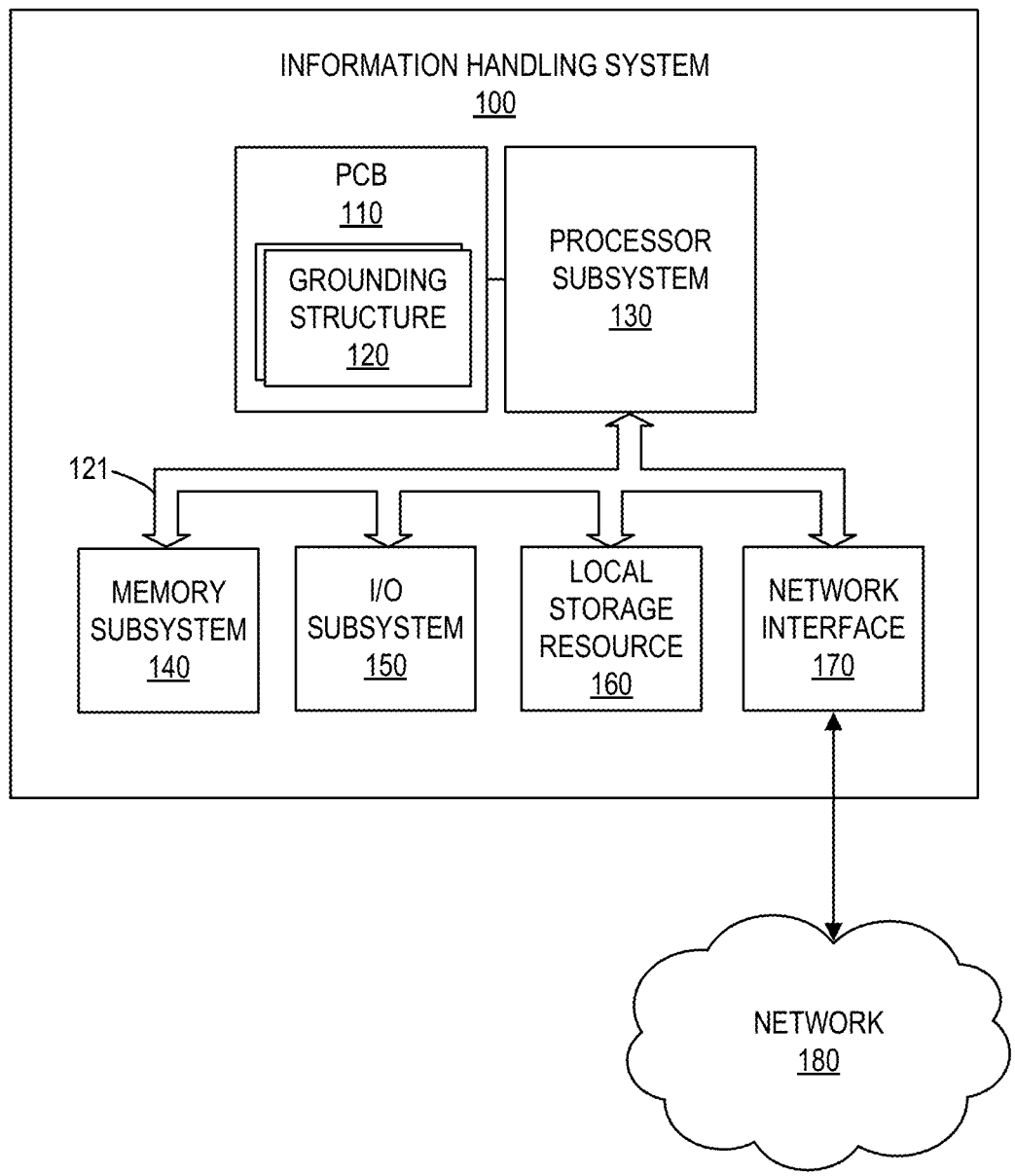
FIG. 1 is a block diagram of selected elements of an embodiment of a computing environment that includes an information handling system.

Turning now to the drawings, FIG. 1 is a block diagram of selected elements of an embodiment of a computing environment that includes an information handling system. Specifically, FIG. 1 illustrates a block diagram depicting selected elements of an information handling system 100 in accordance with some embodiments of the present disclosure. In other embodiments, information handling system 100 may represent different types of portable information handling systems, such as, display devices, head mounted displays, head mount display systems, smart phones, tablet computers, notebook computers, media players, foldable display systems, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems.

In the embodiment illustrated in FIG. 1, components of information handling system 100 may include, but are not limited to, a processor subsystem 130, which may comprise one or more processors, and system bus 121 that communicatively couples various system components to processor subsystem 130 including, for example, a memory subsystem 140, an I/O subsystem 150, a local storage resource 160, and a network interface 170. System bus 121 may represent a variety of suitable types of bus structures (e.g., a memory bus, a peripheral bus, or a local bus) using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express (PCIe) bus, HyperTransport (HT) bus, and Video Electronics Standards Association (VESA) local bus. As shown in FIG. 1, information handling system 100 may additionally include one or more printed circuit boards (PCBs) 110 that each include one or more grounding structures 120. In other embodiments, computing environment 190 may include additional, fewer, and/or different components than the components shown in FIG. 1.

In information handling system 100, processor subsystem 130 may comprise a system, device, or apparatus operable to interpret and/or execute program instructions and/or process data, and may include a central processing unit (CPU), microprocessor, microcontroller, digital signal processor (DSP), application specific integrated circuit (ASIC), or another digital or analog circuitry configured to interpret and/or execute program instructions and/or process data. In some embodiments, processor subsystem 130 may interpret and/or execute program instructions and/or process data stored locally (e.g., in memory subsystem 140 and/or another component of information handling system 100). In the same or alternative embodiments, processor subsystem 130 may interpret and/or execute program instructions and/or process data stored remotely. In one embodiment, processor subsystem 130 may be or include a multi-core processor comprised of one or more processing cores disposed upon an integrated circuit (IC) chip. In other embodiments, processor subsystem 130 may be or include an integrated device (e.g., microcontroller, system on a chip (SoC), and the like) that includes dedicated memory, peripheral interfaces, and/or other components suitable for interpreting and/or executing program instructions and/or processing data.

In one embodiment, memory subsystem 140 may comprise a system, device, or apparatus operable to retain and/or retrieve program instructions and/or data for a period of time (e.g., computer-readable media). Memory subsystem 140 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In one embodiment, I/O subsystem 150 may comprise a system, device, or apparatus generally operable to receive and/or transmit data to, from, and/or within information handling system 100. I/O subsystem 150 may represent, for example, a variety of communication interfaces, graphics interfaces, video interfaces, user input interfaces, and/or peripheral interfaces. In various embodiments, I/O subsystem 150 may be used to support various peripheral devices, such as a touch panel, a display adapter, a keyboard, an accelerometer, a touch pad, a gyroscope, an IR sensor, a microphone, a sensor, a camera, or another type of peripheral device.

In one embodiment, local storage resource 160 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data.

In one embodiment, network interface 170 may be a suitable system, apparatus, or device operable to serve as an interface between information handling system 100 and a network 180. Network interface 170 may enable information handling system 100 to communicate over network 180 using a suitable transmission protocol and/or standard, including, but not limited to, transmission protocols and/or standards enumerated below with respect to the discussion of network 180. Network 180 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), a Cloud network, an Edge network, an intranet, the Internet or another appropriate architecture or system that facilitates the communication of signals, data and/or messages (generally referred to as data). Network interface 170 may enable wired and/or wireless communications (e.g., NFC or Bluetooth) to and/or from information handling system 100.

In particular embodiments, network 180 may include one or more routers for routing data between client information handling systems 100 and server information handling systems 100. A device (e.g., a client information handling system 100 or a server information handling system 100) on network 180 may be addressed by a corresponding network address including, for example, an Internet protocol (IP) address, an Internet name, a Windows Internet name service (WINS) name, a domain name or other system name. In particular embodiments, network 180 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

In one embodiment, network 180 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 180 and its various components may be implemented using hardware, software, or any combination thereof.

In one embodiment, PCB 110 may be a suitable system, apparatus, or device operable to provide a substrate upon which one or more devices of information handling system 100 may be disposed. In particular, PCB 110 may be comprised of conductive and insulating layers operable to provide a structure on which one or more devices (e.g., processor subsystem 130, memory subsystem 140, local storage resource 160, and the like) may be communicably coupled within information handling system 100. For example, PCB 110 may be or include a motherboard of information handling system 100 operable to communicably couple one or more devices such that the one or more devices may perform respective computing operations. In one embodiment, PCB 110 may include one or more vias, or "signal vias," operable for transferring signals through PCB 110 (e.g., signal via 240 shown in FIGS. 2A and 2B). Specifically, each signal via may be comprised of a conductive material (e.g., copper, silver, gold-plated alloy, and the like) operable for transferring signals from a first surface of PCB 110 to a second surface of PCB 110. For example, signal via 240 (shown in FIGS. 2A and 2B) may transfer one or more high-speed signals from top surface 270 of PCB 110 to bottom surface 280 of PCB 110. That is, signal via 240 may receive a high-speed signal through trace 250 disposed on top surface 270 of PCB 110 and may transfer the high-speed signal through one or more inner layers 290 of PCB 110 to trace 260 disposed on bottom surface 280.

Conventionally, a PCB may include one or more vias, or "ground vias," disposed on the PCB operable to provide a ground reference for signals transferred horizontally across a layer (e.g., a top surface, bottom surface, inner layers, and the like) of the PCB. However, such ground vias may be disposed several mils (e.g., 2 to 3 mils) away from signal vias operable to vertically transfer the signals from the layer to one or more additional layers of the PCB, thereby providing a ground reference for the signals in a horizonal plane only. That is, such ground vias may fail to provide a ground reference in a vertical plane, or a "vertical ground reference," for the signals as they are transferred through the signal vias from a first surface of the PCB to a second surface of the PCB. For example, stitching vias may be utilized on a conventional PCB to provide a ground reference proximate to a high-speed signal propagating through one or more traces disposed on a surface of the PCB. However, such stitching vias may provide the ground reference in a horizontal plane (i.e., parallel to the surface upon which the traces are disposed) such that the high-speed signal may no longer be provided with a ground reference as the high-speed signal is transferred through a signal via to one or more layers of the conventional PCB. As such, signals transferred through the signal vias may experience an insertion loss in which the quality of the respective signals may diminish as the signals are transferred through the conventional PCB, thereby decreasing system reliability and overall user experience. In contrast, PCB 110 may include one or more grounding structures 120 operable for providing a vertical ground reference for a signal being transferred from a first surface of PCB 110 to a second surface of PCB 110. PCB 110 is described in further detail with respect to FIGS. 2A through 3.

Figure 2A:
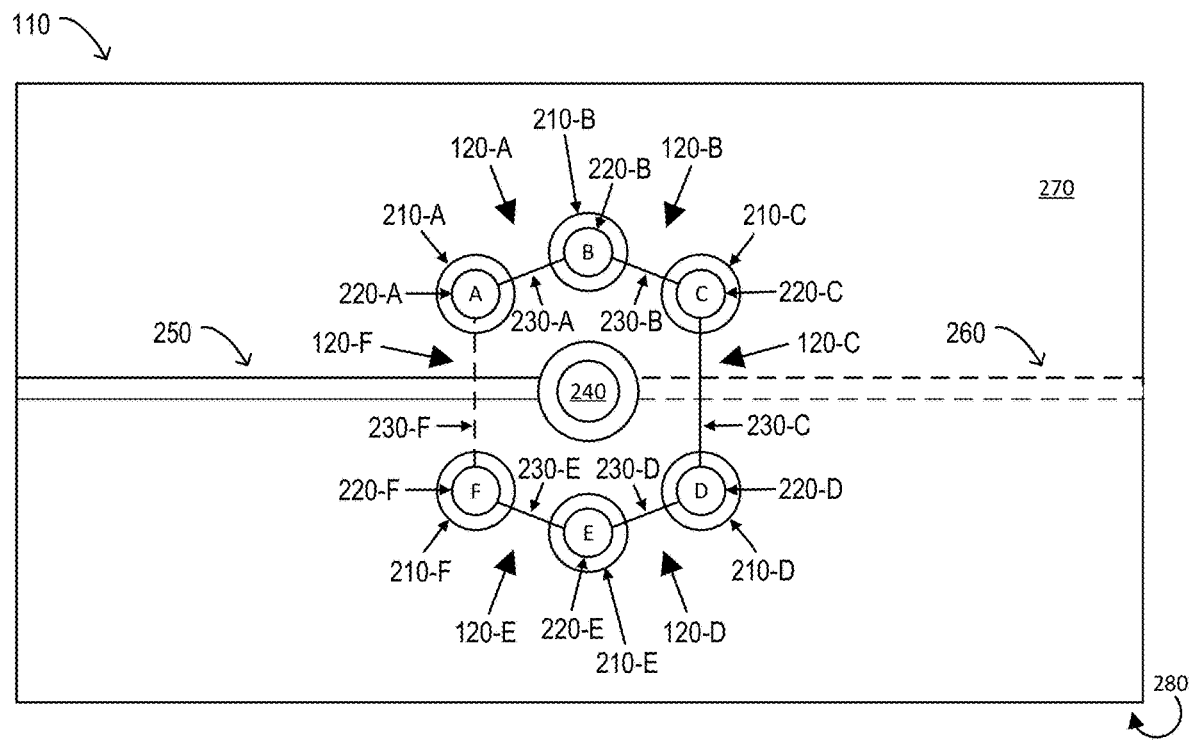
FIGS. 2A and 2B illustrate a top view of selected elements of an embodiment of a printed circuit board of an information handling system that includes grounding structures.
Figure 2B:
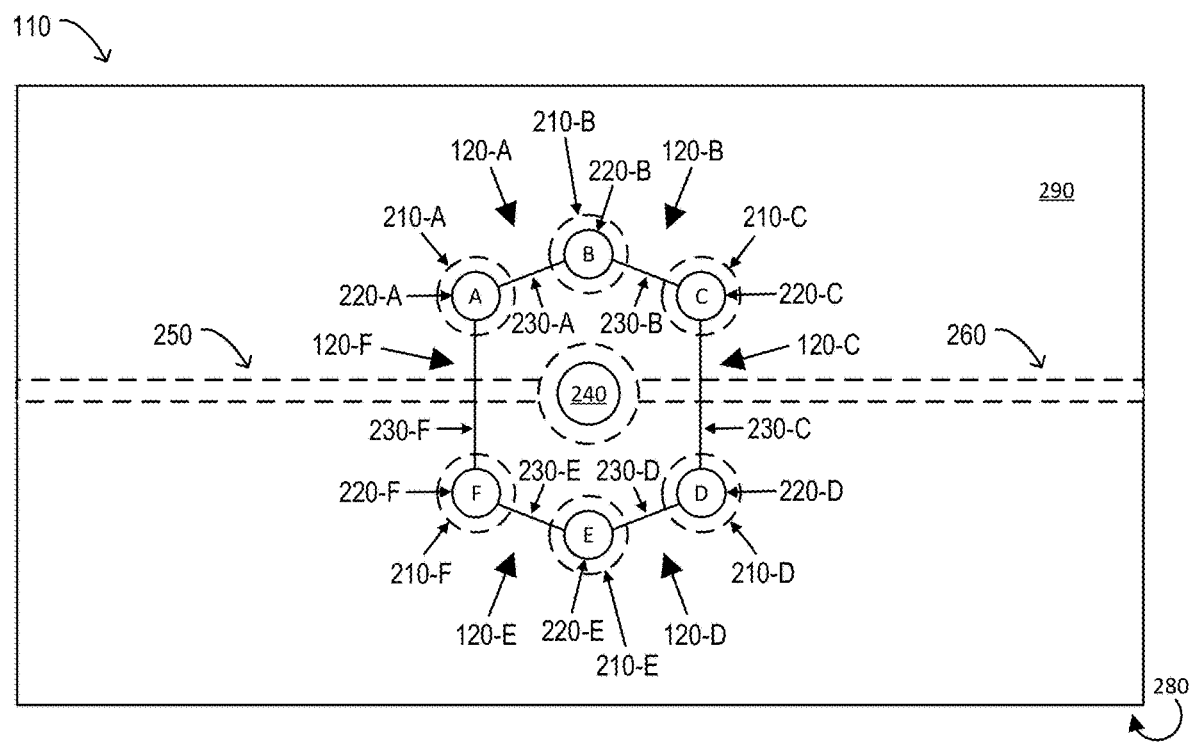

In one embodiment, each grounding structure 120 may be a suitable system, apparatus, or device operable to provide a vertical ground reference for a signal transferred from a first surface of PCB 110 to a second surface of PCB 110 through a signal via. In particular, grounding structure 120 may be or include a conductive material (e.g., copper, silver, gold-plated alloy, and the like) disposed on, and/or within, PCB 110 operable to cause errant current to flow from a signal via into a common point, or "ground layer," of an electrical circuit comprised of the signal via, grounding structure 120, and PCB 110. In one embodiment, grounding structure 120 may include a first ground via electrically coupled to the ground layer of PCB 110. Grounding structure 120 may additionally include a second ground via electrically coupled to the ground layer and a conductive strip electrically coupling the first ground via to the second ground via. The conductive strip of grounding structure 120 may provide a vertical ground reference for a signal transferred from a first surface of PCB 110 to a second surface of PCB 110. In one embodiment, PCB 110 may include several (e.g., 6 or more) grounding structures 120 electrically coupled together (e.g., as shown in FIGS. 2A and 2B) such that the grounding structures 120 form a hexagonal structure encompassing the signal via. As such, the conductive strip of each grounding structure 120 encompassing the signal via may provide a vertical ground reference for the signal transferred through the signal via, thereby increasing overall signal quality. For example, the vertical ground reference provided by the conductive strip of each grounding structure 120 may cause an insertion loss decrease of 0.033 dB in the signal. Grounding structure 120 is described in further detail with respect to FIGS. 2A through 3.

FIGS. 2A and 2B illustrate a top view of selected elements of an embodiment of a printed circuit board of an information handling system that includes grounding structures. Specifically, FIG. 2A illustrates a top surface 270 of PCB 110. FIG. 2B illustrates one or more inner layers 290 of PCB 110. Bottom surface 280 of PCB 110 includes trace 260 and is shown to be underneath top surface 270 and the one or more inner layers 290 of PCB 110. It is noted that in the embodiment illustrated in FIGS. 2A and 2B, one or more components of PCB 110 may have been omitted for clarity, and/or illustrative purposes. In other embodiments, PCB 110 may include additional, fewer, and/or different components than the components shown in the embodiment illustrated in FIGS. 2A and 2B.

In the embodiment illustrated in FIG. 2A, top surface 270 of PCB 110 includes grounding structures 120-A, 120-B, 120-C, 120-D, and 120-E disposed proximate to signal via 240. Each grounding structure 120 may include a first ground via electrically coupled to a ground layer (not shown in figure) of PCB 110. Each grounding structure 120 may additionally include a second ground via electrically coupled to the ground layer and a conductive strip 230 electrically coupling the first ground via to the second ground via. This is shown in FIG. 2A where grounding structure 120-A includes ground via A (first ground via) and ground via B (second ground via) electrically coupled by conductive strip 230-A. Similarly, grounding structure 120-B includes ground via B and ground via C electrically coupled by conductive strip 230-B, grounding structure 120-C includes ground via C and ground via D electrically coupled by conductive strip 230-C, grounding structure 120-D includes ground via D and ground via E electrically coupled by conductive strip 230-D, and grounding structure 120-E includes ground via E and ground via F electrically coupled by conductive strip 230-E. Each ground via A-F may include a first conductive pad 210 (e.g., disposed on top surface 270), a second conductive pad 210 (e.g., disposed on bottom surface 280), and a conductive tube 220 coupling the first conductive pad 210 to the second conductive pad 210. The conductive tube 220 may be electrically coupled to conductive strip 230 and the ground layer of PCB 110. This is shown in FIG. 2A where ground via A includes conductive pad 210-A disposed on top surface 270, conductive pad 210 disposed on bottom surface 280 (not shown in figure), and conductive tube 220-A. It is noted that the embodiment of top surface 270 illustrated in FIG. 2A omits grounding structure 120-F including conductive strip 230-F (shown in dotted lines). Specifically, grounding structure 120-F has been omitted from top surface 270 to provide clearance for trace 250 that is shown electrically coupled to signal via 240. Other embodiments of bottom surface 280 may include grounding structure 120-F including conductive strip 230-F. In this embodiment, grounding structure 120-C may be omitted from bottom surface 280 to provide clearance for trace 260 that is shown electrically coupled to signal via 240.

In the embodiment illustrated in FIG. 2B, inner layers 290 of PCB 110 include grounding structures 120-A through 120-F. As described above with respect to FIG. 2A, each grounding structure 120 may include a first ground via electrically coupled to a ground layer (not shown in figure) of PCB 110. Each grounding structure 120 may additionally include a second ground via electrically coupled to the ground layer and a conductive strip 230 electrically coupling the first ground via to the second ground via. This is shown in FIG. 2B where grounding structure 120-C includes ground via C (first ground via) and ground via D (second ground via) electrically coupled by conductive strip 230-C. Similarly, grounding structure 120-F includes ground via F and ground via A electrically coupled by conductive strip 230-F. As shown in FIG. 2B, conductive strips 230-A through 230-F may be disposed within inner layers 290 of PCB 110 such that conductive strips 230-A through 230-F may be oriented orthogonally in relation to the inner layers 290. That is, each conductive strip 230 disposed orthogonally within inner layers 290 of PCB 110 may be oriented in parallel to signal via 240, thereby providing a vertical ground reference for the signal transferred through signal via 240.

In the embodiment illustrated in FIG. 2B, grounding structures 120-A through 120-F form a hexagonal structure encompassing signal via 240. As such, the conductive strip 230 of each grounding structure 120 encompassing signal via 240 may provide a vertical ground reference for the signal transferred through signal via 240, thereby increasing overall signal quality. For example, the vertical ground reference provided by conductive strips 230-A through 230-F of each grounding structure 120-A through 120-F may cause an insertion loss decrease of 0.033 dB in the signal. In other embodiments, PCB 110 may include additional, fewer, and/or different grounding structures 120 than the grounding structures 120 shown in the embodiment illustrated in FIGS. 2A and 2B. For example, PCB 110 may include four or more additional grounding structures 120 to form a circular, or ring-shaped, structure encompassing signal via 240.

Figure 3:
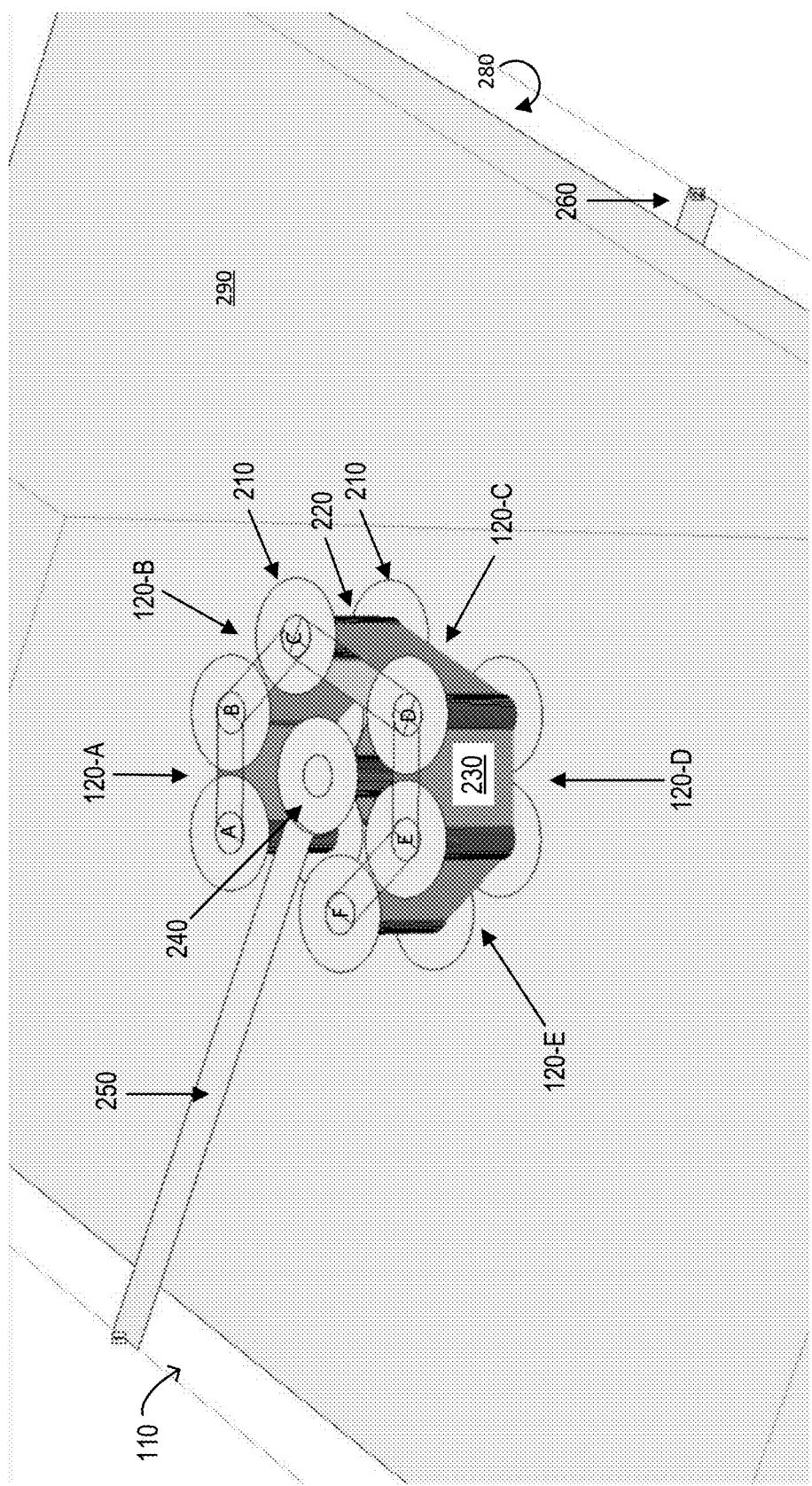
FIG. 3 illustrates a front three-quarter view of selected elements of an embodiment of a printed circuit board of an information handling system that includes grounding structures.

FIG. 3 illustrates a front three-quarter view of selected elements of an embodiment of a printed circuit board of an information handling system that includes grounding structures. In the embodiment illustrated in FIG. 3, PCB 110 includes grounding structures 120-A, 120-B, 120-C, 120-D, and 120-E as described above with respect to FIG. 2A. Each grounding structure 120 may include a first ground via electrically coupled to a ground layer (not shown in figure) of PCB 110. Each grounding structure 120 may additionally include a second ground via electrically coupled to the ground layer and a conductive strip 230 electrically coupling the first ground via to the second ground via. This is shown in FIG. 3 where grounding structure 120-D includes ground via D (first ground via) and ground via E (second ground via) electrically coupled by conductive strip 230. Each ground via A-F may include a first conductive pad 210 (e.g., disposed on top surface 270), a second conductive pad 210 (e.g., disposed on bottom surface 280), and a conductive tube 220 coupling the first conductive pad 210 to the second conductive pad 210. The conductive tube 220 may be electrically coupled to conductive strip 230 and the ground layer of PCB 110 (not shown in figure) as described above with respect to FIGS. 2A and 2B. As shown in FIG. 3, conductive strips 230 may be disposed within inner layers 290 of PCB 110 such that conductive strips 230 may be oriented orthogonally in relation to the inner layers 290. That is, each conductive strip 230 disposed orthogonally within inner layers 290 of PCB 110 may be oriented in parallel to signal via 240, thereby providing a vertical ground reference for the signal transferred through signal via 240.

FIG. 4 is a flowchart depicting selected elements of an embodiment of a method for increasing a signal quality in an information handling system. It is noted that certain operations described in method 400 may be optional or may be rearranged in different embodiments.

Method 400 may begin at step 410, where a signal via disposed on a printed circuit board (PCB) of the information handling system may transfer a signal from a first surface of the PCB to a second surface of the PCB. For example, signal via 240 may transfer one or more high-speed signals from top surface 270 of PCB 110 to bottom surface 280 of PCB 110 as described above with respect to FIG. 1. In step 420, a conductive strip of a grounding structure disposed on the PCB may provide a vertical ground reference for the signal transferred from the first surface to the second surface through the signal via. The conductive strip may electrically couple a first ground via of the grounding structure to a second ground via of the grounding structure. For example, the conductive strip 230 of each grounding structure 120 encompassing signal via 240 may provide a vertical ground reference for the signal transferred through signal via 240, thereby increasing overall signal quality as described above with respect to FIG. 2B. Grounding structure 120-C includes ground via C (first ground via) and ground via D (second ground via) electrically coupled by conductive strip 230-C as described above with respect to FIG. 2B.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An information handling system, comprising:
   a printed circuit board (PCB) having a first surface and a second surface;
   a signal via disposed on the PCB, the signal via configured to transfer a signal from the first surface to the second surface; and
   a grounding structure disposed on the PCB, the grounding structure including:
      a first ground via electrically coupled to a ground layer of the PCB;
      a second ground via electrically coupled to the ground layer of the PCB; and
      a conductive strip electrically coupling the first ground via to the second ground via, the conductive strip providing a vertical ground reference for the signal transferred from the first surface to the second surface through the signal via
      wherein the first ground via and the second ground via include:
         a first conductive pad disposed on the first surface;
         a second conductive pad disposed on the second surface; and
         a conductive tube coupling the first conductive pad to the second conductive pad, the conductive tube electrically coupled to conductive strip and the ground layer of the PCB.

2. The information handling system of claim 1, wherein the grounding structure is disposed on the PCB proximate to the signal via.

3. The information handling system of claim 1, wherein the conductive strip is disposed within one or more inner layers of the PCB, the conductive strip oriented orthogonally in relation to the one or more inner layers.

4. The information handling system of claim 1, wherein the information handling system further includes:
   an additional grounding structure disposed on the PCB, the additional grounding structure including:
   a third ground via electrically coupled to the ground layer of the PCB; and
   an additional conductive strip electrically coupling the third ground via to the second ground via, the additional conductive strip providing the vertical ground reference for the signal transferred from the first surface to the second surface through the signal via.

5. The information handling system of claim 4, wherein the third ground via includes:
   a first conductive pad disposed on the first surface;
   a second conductive pad disposed on the second surface; and
   a conductive tube coupling the first conductive pad to the second conductive pad, the conductive tube electrically coupled to the additional conductive strip and the ground layer of the PCB.

6. The information handling system of claim 4, wherein the additional grounding structure is disposed on the PCB proximate to the signal via and the grounding structure.

7. The information handling system of claim 4, wherein the additional conductive strip is disposed within one or more inner layers of the PCB, the additional conductive strip oriented orthogonally in relation to the one or more inner layers.

8. The information handling system of claim 1, wherein providing the vertical ground reference for the signal causes an insertion loss associated with the signal to be decreased.

9. A method, comprising:
transferring, by a signal via disposed on a printed circuit board (PCB) of the information handling system, a signal from a first surface of the PCB to a second surface of the PCB; and
providing, by a conductive strip of a grounding structure disposed on the PCB, a vertical ground reference for the signal transferred from the first surface to the second surface through the signal via, the conductive strip electrically coupling a first ground via of the grounding structure to a second ground via of the grounding structure, wherein the first ground via and the second ground via including a first conductive pad disposed on the first surface, a second conductive pad disposed on the second surface, and a conductive tube coupling the first conductive pad to the second conductive pad, the conductive tube electrically coupled to the conductive strip and the PCB.

10. The method of claim 9, further comprising:
causing, by the vertical ground reference provided by the conductive strip, an insertion loss associated with the signal to be decreased.

11. A grounding structure for a printed circuit board (PCB) of an information handling system, comprising:
a first ground via electrically coupled to a ground layer of the PCB;
a second ground via electrically coupled to the ground layer of the PCB; and
a conductive strip electrically coupling the first ground via to the second ground via, the conductive strip providing a vertical ground reference for a signal transferred from a first surface of the PCB to a second surface of the PCB through a signal via disposed on the PCB
wherein the first ground via and the second ground via include:
a first conductive pad disposed on the first surface;
a second conductive pad disposed on the second surface; and
a conductive tube coupling the first conductive pad to the second conductive pad, the conductive tube electrically coupled to conductive strip and the ground layer of the PCB.

12. The grounding structure of claim 11, wherein the grounding structure is disposed on the PCB proximate to the signal via.

13. The grounding structure of claim 11, wherein the conductive strip is disposed within one or more inner layers of the PCB, the conductive strip oriented orthogonally in relation to the one or more inner layers.

14. The grounding structure of claim 11, wherein the information handling system further includes:
an additional grounding structure disposed on the PCB, the additional grounding structure including:
a third ground via electrically coupled to the ground layer of the PCB; and
an additional conductive strip electrically coupling the third ground via to the second ground via, the additional conductive strip providing the vertical ground reference for the signal transferred from the first surface to the second surface through the signal via.

15. The grounding structure of claim 14, wherein the additional conductive strip is disposed within one or more inner layers of the PCB, the additional conductive strip oriented orthogonally in relation to the one or more inner layers.

16. The grounding structure of claim 14, wherein the third ground via includes:
a first conductive pad disposed on the first surface;
a second conductive pad disposed on the second surface; and
a conductive tube coupling the first conductive pad to the second conductive pad, the conductive tube electrically coupled to the additional conductive strip and the ground layer of the PCB.

17. The grounding structure of claim 14, wherein the additional grounding structure is disposed on the PCB proximate to the signal via and the grounding structure.

18. The grounding structure of claim 11, wherein providing the vertical ground reference for the signal causes an insertion loss associated with the signal to be decreased.

* * * * *